United States Patent [19]
Dawson et al.

[11] Patent Number: 5,484,964
[45] Date of Patent: Jan. 16, 1996

[54] SURFACE MOUNTING PIN GRID ARRAYS

[76] Inventors: Peter F. Dawson, deceased, late of Portola Valley, Calif.; by Shirley B. Dawson, executor, 25 Tintern La., Portola Valley, Calif. 94028; Jacques Leibovitz, 1536 Larkspur Dr., San Jose, Calif. 95125; Voddarahalli K. Nagesh, 20276 Pinntage Pwky., Cupertino, Calif. 95014

[21] Appl. No.: 384,186

[22] Filed: Feb. 6, 1995

[51] Int. Cl.$^6$ .................................................. H05K 1/14
[52] U.S. Cl. ....................... 174/261; 174/260; 361/791; 439/50; 439/83; 439/65; 439/79
[58] Field of Search .................................. 174/260, 261; 361/784, 785, 790, 791; 439/44, 45, 47, 50, 83, 78, 65, 74, 75

[56] References Cited

U.S. PATENT DOCUMENTS

| | | | |
|---|---|---|---|
| 3,924,918 | 12/1975 | Friend | 339/17 M |
| 4,295,700 | 10/1981 | Sado | 339/61 M |
| 5,324,892 | 6/1994 | Granier et al. | 174/250 |
| 5,390,078 | 2/1995 | Taylor | 361/721 |

*Primary Examiner*—Laura Thomas

[57] ABSTRACT

The present invention is a double headed pin for electrically interconnecting a PGA substrate carrier to a surface mount printed circuit board. The double headed pins provide for a stronger interconnection to the conductive pads on the surface mount printed circuit board. The increase in contact and soldering wetting area makes the interconnections stronger and more durable.

9 Claims, 3 Drawing Sheets

SURFACE MOUNTING PIN GRID ARRAYS

FIELD OF THE INVENTION

This invention relates to a method of connecting electronic circuits, and more specifically to electrical connections between a substrate carrier and a surface mount printed circuit board.

BACKGROUND

Electronic packaging generally contains many layers of packages and electrical interconnections. A first layer may connect one or more integrated circuit chips on a substrate carder. A second layer may interconnect one or more substrate carriers on a printed circuit board. Typically, the interconnections between the substrate carriers and printed circuit boards are accomplished by providing rigid metal pins which are brazed onto the substrate carder. The substrate carriers with rigid pins are subsequently plugged into a connector or wave soldered to an array of plated through holes on the printed circuit board.

Advancement in the performance of electronic integrated circuits is constantly increasing the demands on electrical interconnection technology. Circuits that operate at higher frequencies demand lower inductance interconnection pins. Increased circuit densities demand more interconnections per integrated circuit. Due to the changing and increasing demands on integrated circuit interconnections, an assortment of interconnection options are presently available.

A pin grid array (PGA) is a leaded substrate which is typically electrically and mechanically connected to a through hole printed circuit board. The mechanical structure of this configuration is very strong and durable. However, because it is a through-hole leaded device, pin grid arrays cover a large amount of circuit board surface area. The large physical size will also limit the high frequency performance of the integrated circuit due to stray inductance and capacitance inherent to the structure.

The advancements in electronic circuit performance have created a demand for printed circuit boards with higher circuit density. Surface mount technology (SMT) printed circuit boards allow for higher circuit density than possible with previously existing circuit board technologies. SMT printed circuit boards are cheaper to produce than conventional through-hole printed circuit boards. Therefore, the trend is to adapt existing technologies such as PGA's to be compatible with SMT printed circuit boards.

Ball grid arrays are an attempt to develop a technology which will allow PGA's to be mounted on SMT printed circuit boards. Ball grid arrays are constructed by placing solder balls directly on the bonding pads on the bottom surface of the PGA substrate. The solder balls are made from a high lead content solder. High lead content solder is softer and has a higher melting temperature than lead/tin eutectic solder. The substrate is then attached directly on a printed circuit board so that the solder balls are in contact with the conductive pads on the SMT printed circuit board. The attached substrate resides proximately close to the printed circuit board. This configuration is advantageous for space and electrical performance reasons. However, when thermally stressed, the printed circuit board expands and contracts at a different rate than the substrate does. The differential in expansion and contraction rates creates shear forces on the solder joint that will tear the solder joints apart. Therefore, ball grid arrays are not an acceptable solution for attaching PGA's to SMT printed circuit boards unless the substrate is very small, or the substrate has been specially selected to have a thermal coefficient of expansion matched to the thermal coefficient of expansion of the printed circuit board. An optimal solution would solve the problems associated with the stresses created on the electrical interconnection joints and still be adaptable to the placement of PGA's on SMT printed circuit boards.

Another method of electrically connecting pin grid arrays to a SMT printed circuit board is through the use of solder column technology. Solder columns are made of high lead solder which makes them soft. The high lead content also makes the melting temperature of solder columns higher then the melting temperature of eutectic tin/lead solder. The solder columns are cast directly on the pads of the PGA substrate. The casting process is very difficult and expensive. Although solder columns provide for durable electrical interconnection joints because the electrical interconnections are soft and able to absorb the stresses that can develop between the substrate of the PGA and a printed circuit board, solder columns easily bend when handled. The alignment of the solder columns to the pads on the printed circuit must be good enough to ensure that an electrical connection is made when the solder column is soldered to the SMT printed circuit board. If the solder columns have been bent or misaligned during handling, the columns must be realigned before attempting to attach the PGA carrier to a printed circuit board. The fact that solder columns interconnection pins bend easily makes manufacturing SMT printed circuit boards with solder column technology PGA's on them difficult. Any interconnection pins on a PGA that are bent must be straightened before the PGA is placed on an SMT printed circuit board. The process of maintaining straight solder column interconnection pins adds to the manufacturing costs.

An optimal solution to interconnecting PGA's to SMT printed circuit boards should be easy to manufacture and provide for strong interconnection joints. Present technologies address some of the problems associated with attaching PGA's to SMT printed circuit boards, but none of the present solutions are both easy to manufacture and provide strong electrical interconnection joints. Therefore, there is presently a need for a novel technology that will satisfy these electronic circuit technology problems.

SUMMARY OF INVENTION

This invention uses double headed pins to electrically interconnect a substrate such as a PGA to a surface mount printed circuit board. Prior methods of PGA electrical interconnection are either unreliable or not easy to manufacture. This invention solves solder joint reliability problems, while still maintaining a low degree of complications in the manufacturing of electronic interconnections.

The double headed pins are used to electrically and mechanically connect the conductive pads of a PGA carrier substrate to the conductive pads of a printed circuit board. Typically, the first head of the double headed pin is brazed to the PGA substrate carrier to form a first connection joint. The second head is soldered to the printed circuit board to form a second connection joint. The heads on the ends of the pin provide for more attachment surface area on the ends of the pins. The greater the attachment surface area on the ends of the pins, the stronger the connection joints will be.

The diameter of the pins will be less than the diameter of the heads, and the diameter of the heads will be less than the diameter of the conductive pads of the SMT printed circuit board they will be soldered to. This structure will provide for a strong interconnection joint where the double headed pin attaches to the SMT printed circuit board. The pin head geometry can be defined so that the solder attaching the pin head to the printed circuit board will flow over the pin head during solder reflow. The result is that the interconnection joint can withstand forces on it in the direction as defined by the length of the double headed pin. Stated differently, the double headed pin interconnection joint can resist forces pulling the pin away from the printed circuit board. The strength of the interconnection joints is significantly increased due to the presence of the heads.

Generally, the temperature required to solder or braze the first head of the double headed pin to the substrate carder is higher than the temperature required to solder the second head to the printed circuit board.

DETAILED DESCRIPTION

This invention proposes a novel interconnection pin structure for attaching large multiple leaded substrates such as a PGA to a surface mount technology (SMT) printed circuit board.

Figure 1:
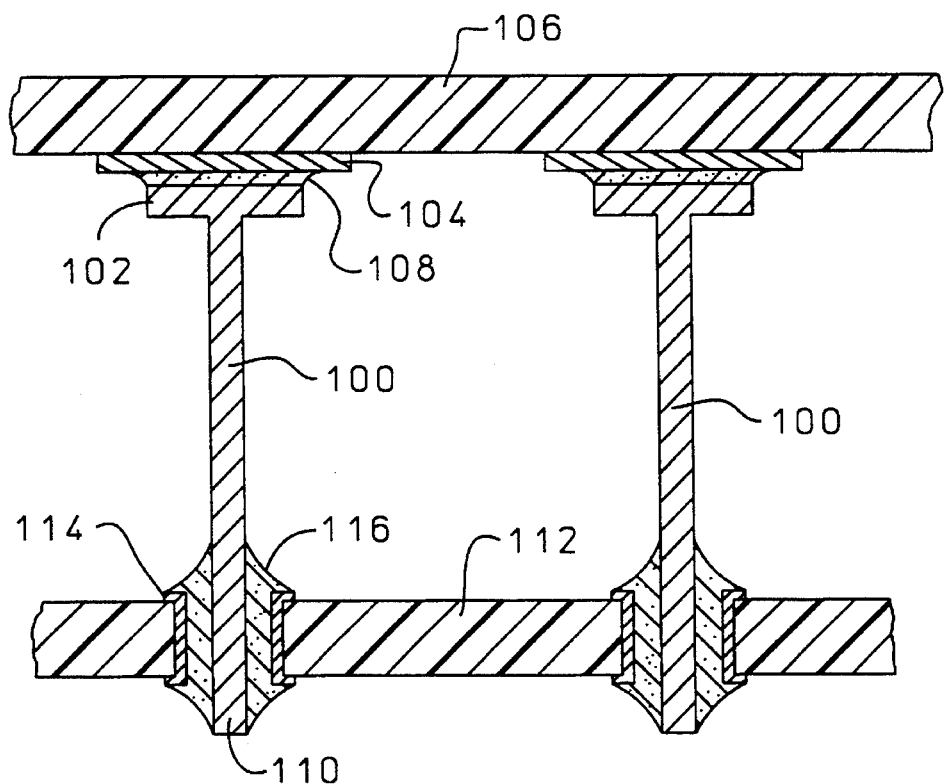
FIG. 1 shows a cross sectional view of pins attached to a through hole printed circuit board (prior art).

FIG. 1 depicts the structure of a PGA pin 100 and the attachment of the pin to a through hole printed circuit board. One end of the pin 100 is shaped to have a flat head 102 attached to a conductive pad 104 on a PGA substrate 106 by a brazed joint 108. The other end of the pin 110 is attached to the board 112 by insertion into a metalized through hole 114 and soldered therein with a solder joint 116. The melting temperature of the brazed joint 108 is higher than that of the solder joint 116. The solder joint 116 is strong because of the large pin surface area held by the solder.

Figure 2:
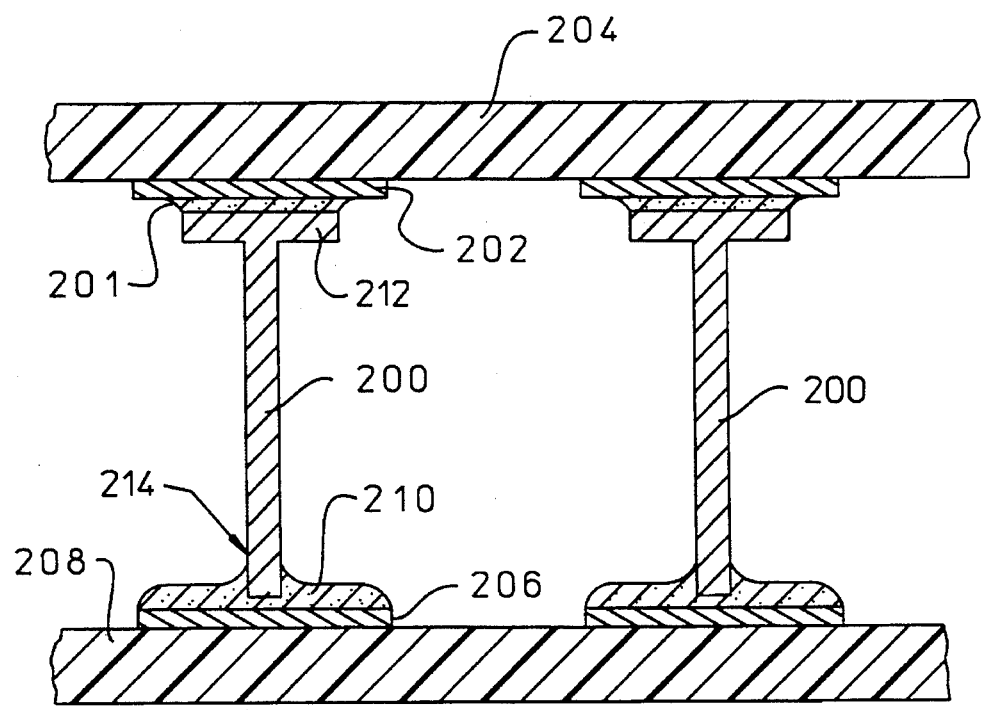
FIG. 2 shows a cross sectional view of pins attached to an SMT printed circuit board.

FIG. 2 depicts the structure of a pin 200 and its attachment to an SMT printed circuit board 208. Pins are used to electrically connect PGA's to printed circuit boards. The interconnections formed by pins between PGA's and through hole printed circuit boards 208 are strong and durable. However, as was described earlier, the trend is to attach PGA's to SMT printed circuit boards. The pin head 212 is usually brazed onto the conductive pad 202 of the substrate carrier 204 to form a brazed joint 201. The other end 214 of the pin 200 can be soldered to a pad 206 on an SMT circuit board 208 to form a solder joint 210. Pins 200 resist bending because they are rigid. However, pins 200 do suffer from other structural limitations. When placed on an SMT printed circuit board 208 so that the pins 200 are in contact with the pads 206 on the printed circuit board, the wetting surface area on the end of the pin 200 is very small. The pins 200 usually have a diameter of about 8 mils to 20 mils. The solder joints 210 between the pins 200 and the pads 206 on the printed circuit board 208 are weak. This is because the amount of surface area on the pin 200 which makes contact with the solder of the joint 210 is very limited. The contact area or wetting surface is small due to the small diameter of the pin 200 and the small amount of surface on the tip of the pin 200 which is in contact with the pads 206 on the printed circuit board 208. Generally, the substrate 204 and the SMT printed circuit board 208 will expand and contract at different rates with respect to temperature. The difference in expansion and contraction rates will create stresses on contact joints 210 where the pin 200 attaches to the printed circuit board 208. In particular, the substrate and printed circuit board assemble will bend akin to a bimetal bending with changes in temperature. Due to the weak structure of the contact joints 210, some of the pins 200 will be pulled off of the printed circuit board 208 due to the stresses that will be created with variations in temperature.

Figure 3:
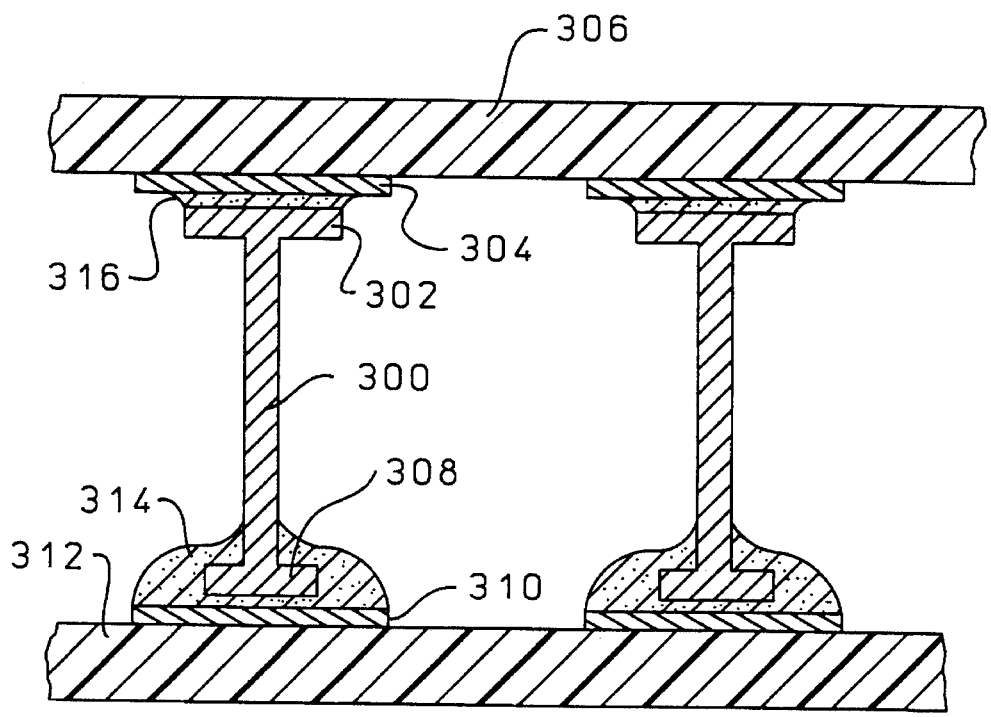
FIG. 3 shows a cross sectional view of the final configuration of the present invention.

FIG. 3 shows the structure of the present invention. The electronic interconnect pins 300 have a first head 302 attached to a conductive pad 304 of substrate carrier 306 and a second head 308 attached to a conductive pad 310 on printed circuit board 312. The addition of the second heads 308 increases the surface area of the interconnect pins 300 where the pins make contact with the pads 310 on the printed circuit board 312.

The electrical interconnection structure of this invention is advantageous because it provides for ample surface area at both end of the pins 300 for providing strong interconnection joints 314, 316 while maintaining a pin 300 that is generally narrow in diameter. The narrow diameter characteristic of the pin 300 will decrease the capacitance between the pins. The surface area of the first head 302 provides enough surface area to make a strong brazed joint 316 to the substrate carrier 306. The surface area of the second head 308 provides more surface area to increase the strength of the solder joint 314 where the pin 300 attaches to the printed circuit board 312. The typical diameter of the pads 310 is greater than 20 mils. For substrate carriers 306 with dense concentrations of pins 300 per unit square inch, the head diameters shall be constrained to about 20 to 30 mils. The cross sectional diameter of non-head portions of the pins 300 is typically 8 mils or greater. Typically, the cross sectional diameter of the pins 300 is less than the diameter of the heads 302, 308.

The substrate carrier 306 is usually made of a ceramic material. The first head 302 of the electrical interconnection pins 300 are typically brazed to the pads 304 on the substrate carrier 306. The substrate carrier 306 must be able to withstand brazing temperatures of approximately 400° C. However, if the first head 302 is soldered to the substrate 306 rather than brazed, then the substrate 306 may not have to be as robust. For example, a 90/10 lead/tin solder can be used to attach the first pin head 302 to the substrate 306 at 340° C. and subsequently attachment to an SMT board 312 can be implemented at 240° C. with eutectic lead/tin solder.

The printed circuit board 312 is usually made of an organic material. Generally, any standard organic printed circuit board will work acceptably with this invention. In some special cases the printed circuit board 312 may be selected so that its expansion and contraction properties with variations with temperature are not excessively different from the expansion and contraction properties of the substrate carrier 306. The pads 310 on the printed circuit board 312 are typically 20 mils or greater in diameter. The greater the density of the PGA pins, the smaller the pad diameter will have to be.

The pins 300 of this invention are typically made of kovar. However, any other material that has similar electrical and mechanical properties will suffice. The pin 300 lengths are usually less than 70 mils. The determination of the optimal pin 300 length is found by balancing the demands of several performance specifications. The stresses on the solder joint 314 of the printed circuit board 312 and the stresses on the brazed joint 316 of the chip carrier 306 will increase as the length of the pin 300 decreases. Decreasing the lengths of the pins 300 also increases the stresses on the chip carrier 306. The stresses are induced when the printed circuit board 312 and the chip carrier 306 expand and contract with temperature at different rates. The amount of stress can be controlled by varying the length of the pins 300. The stress can also be reduced by selecting printed circuit boards 312 with temperature variation characteristics compatible with those of the substrate carrier 306.

Increasing the pin 300 length will decrease the mechanical stresses. But it will increase inductance. However, high frequency circuit performance requires the electronic circuit interconnections to have as little inductance as is reasonably possible. Therefore, the frequency at which the circuits operate will also determine the pin 300 length selection.

Figure 4:
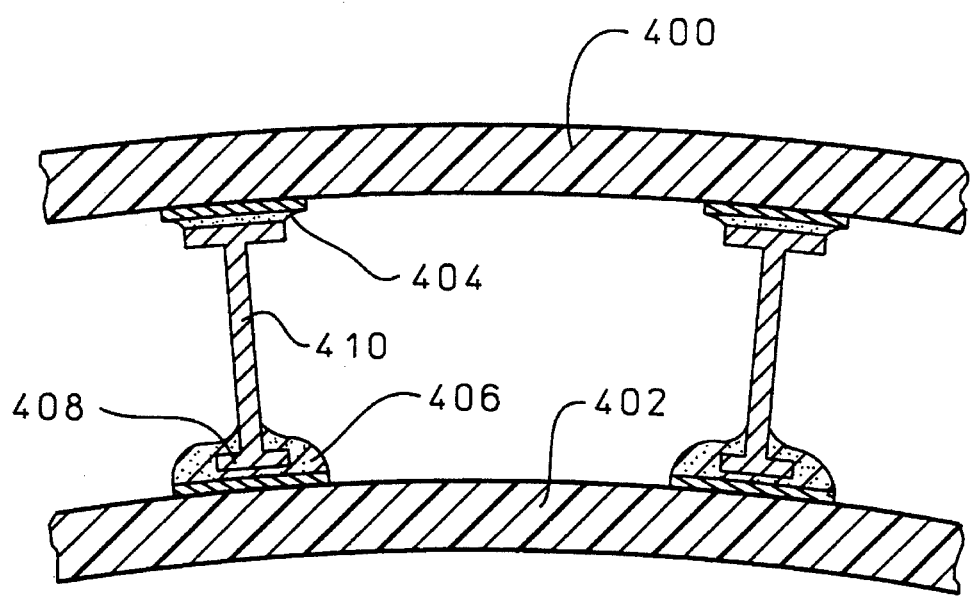
FIG. 4 shows a cross sectional view of the deformation of a PGA and a printed circuit board that can occur with variations in temperature.

FIG. 4 depicts the deformation of the substrate 400 and printed circuit board 402 that may occur when the expansion and contraction characteristics of the substrate 400 and the printed circuit board 402 are different. The curvature of the substrate 400 and the printed circuit board 402 have been exaggerated to aid in the depiction of the forces on the interconnection joints 404 and 406. Without the head 408 on the pin 410, the joint 406 would be torn apart by the forces imposed upon it.

The double headed pins of this invention are similar in form to the double heads of double headed nails used in building construction. Double headed nails are used in construction for making molds for setting concrete. Wet concrete is poured into molds made of wood. The molds are held together with double headed nails. When the concrete has dried, the molds are pulled apart leaving the hard cement. The fact that the molds are held together with double headed nails makes it easier to remove them. The process of manufacturing the double headed pins of this invention is similar to the process of manufacturing double headed construction nails.

Figure 5:
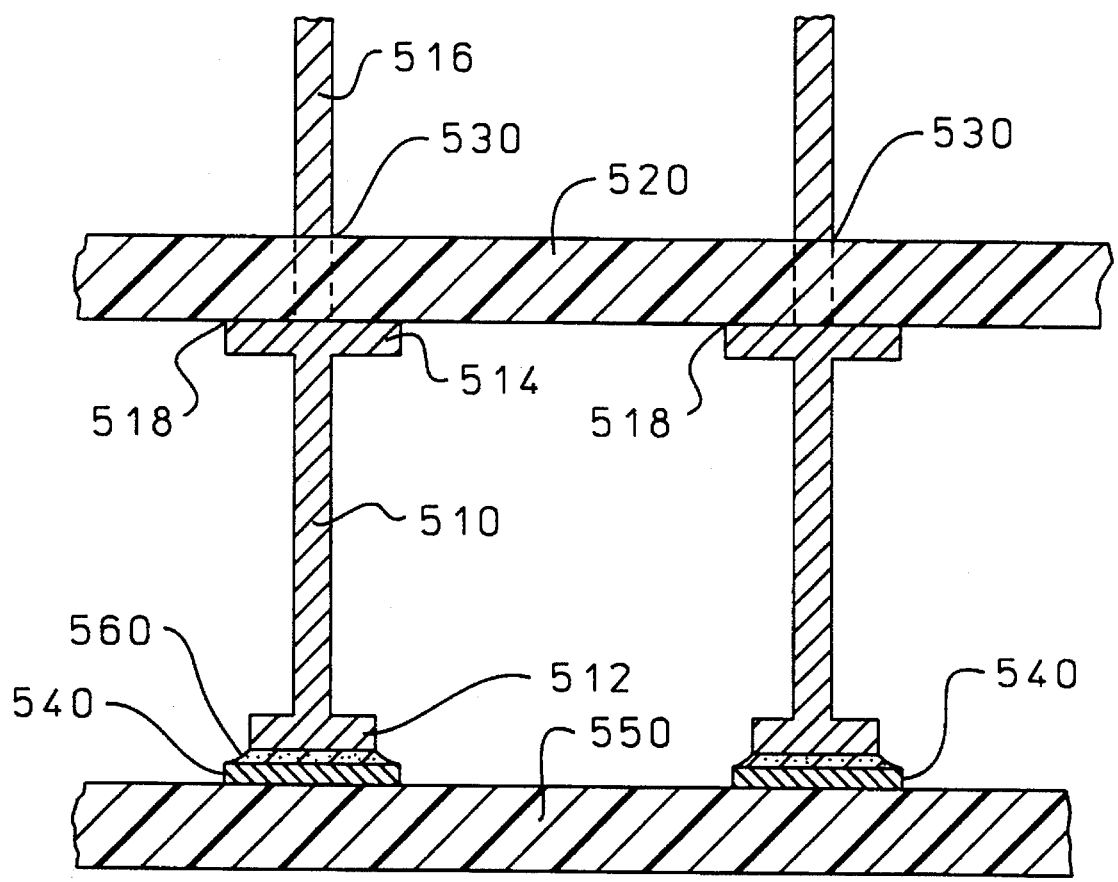
FIG. 5 shows a method of attaching double headed pins to a PGA substrate.

FIG. 5 shows a method of attaching the double headed pins to a substrate. The double headed pins 5 10 are produced by a similar process as double headed construction nails. The pins are formed so that there is a first head 512, a second head 514 and an extended portion 516. A jig 520 is fabricated which has a pattern of holes 530 which match the locations of the conductive pads 540 on the substrate 550. A double headed pin 510 is placed in each of the holes 530 of the jig so that the double heads 512,514 of each pin 510 are on one side of the jig 520 and the extended portion 516 of the pins 510 are on the other side of the jig 520. Brazing paste 560 is placed on each of the conductive pads 540 of the substrate 550. The first heads 512 of each of the double headed pins 510 is placed in contact with a corresponding brazing paste 560 covered conductive pad 540. The brazing paste is heated and then cooled resulting in secure joints where the first heads 512 make contact with the conductive pads 540 of the substrate 550. The first heads 512 can be soldered to the conductive pads 540 of the substrate 550 instead of being brazed. Finally, the extended portion 516 of the double headed pins 510 is trimmed, for example, with a circular saw, so that the second head 514 is left with a flat surface 518. The length of all of the double headed pins 510 will be substantially the same length after the extended portions have been trimmed. Finally, the second heads 514 may be soldered to the conductive pads of an SMT printed circuit board.

We claim:

1. A method of forming an electronic interconnection structure between a substrate and a printed circuit board, the interconnection comprising at least one double headed interconnect pin, the double headed interconnect pin having a first head and a second head, the method comprising the steps of:

attaching the first head to a conductive pad on the substrate so that the interconnect pin extends substantially perpendicularly from the substrate; and soldering the second head to a conductive pad on the printed circuit board such that the interconnect pin extends substantially perpendicularly from the printed circuit board.

2. A method of forming an electronic interconnection structure as recited in claim 1, wherein the step of attaching includes brazing the first head to a conductive pad on the substrate.

3. A method of forming an electronic interconnection structure as recited in claim 1, wherein the step of attaching includes soldering the first head to a conductive pad on the substrate.

4. An electronic interconnection for interconnecting a substrate having at least one conductive pad and a printed circuit board having at least one conductive pad comprising:

a conductive interconnection pin having a first end and a second end, the first end having a first head and the second end having a second head; wherein the first head is attached to the conductive pad on the substrate; and the second head is soldered to the conductive pad on the printed circuit board.

5. An electronic interconnection as recited in claim 4, wherein the first head is brazed to the conductive pad on the substrate.

6. An electronic interconnection as recited in claim 4, wherein the first head is soldered to the conductive pad on the substrate.

7. The electronic interconnection of claim 4, wherein the cross sectional area of the second head is greater than the center cross sectional area of the interconnection pin at its mid-section.

8. The electronic interconnection of claim 5, wherein the temperature required to braze the first head to the conductive pad on the substrate is greater than the temperature required to solder the second head to the conductive pad on the printed circuit board.

9. The electronic interconnection of claim 6, wherein the temperature required to solder the first head to the conductive pad on the substrate is greater than the temperature required to solder the second head to the conductive pad on the printed circuit board.

* * * * *